United States Patent
Toda et al.

(10) Patent No.: US 7,431,861 B2
(45) Date of Patent: Oct. 7, 2008

(54) ETCHANT, REPLENISHMENT SOLUTION AND METHOD FOR PRODUCING COPPER WIRING USING THE SAME

(75) Inventors: Kenji Toda, Amagasaki (JP); Yukari Morinaga, Amagasaki (JP); Takahiro Teshima, Amagasaki (JP); Ai Kuroda, Amagasaki (JP)

(73) Assignee: Mec Company Ltd., Hyogo (JP)

( * ) Notice: Subject to any disclaimer, the term of this patent is extended or adjusted under 35 U.S.C. 154(b) by 250 days.

(21) Appl. No.: 10/896,465

(22) Filed: Jul. 22, 2004

(65) Prior Publication Data

US 2005/0016961 A1   Jan. 27, 2005

(30) Foreign Application Priority Data

Jul. 25, 2003  (JP)  ............................. 2003-280118
Apr. 20, 2004  (JP)  ............................. 2004-124375

(51) Int. Cl.
*C03C 15/00* (2006.01)

(52) U.S. Cl. .......................... 216/93; 216/92; 216/105; 438/692; 438/745; 438/754; 438/748; 252/79.1

(58) Field of Classification Search ................ 252/79.1, 252/79.4; 438/745
See application file for complete search history.

(56) References Cited

U.S. PATENT DOCUMENTS

| 4,849,124 | A | 7/1989 | Backus |
| 6,156,221 | A | 12/2000 | Lauffer et al. |
| 6,162,366 | A | 12/2000 | Ishikura et al. |
| 6,410,442 | B1 * | 6/2002 | Yang .......................... 438/692 |
| 6,444,140 | B2 | 9/2002 | Schemenaur et al. |
| 7,232,528 | B2 * | 6/2007 | Hosomi et al. ................ 252/79 |

FOREIGN PATENT DOCUMENTS

| DE | 25 57 269 | 6/1977 |
| EP | 0 252 295 | 1/1988 |
| EP | 63-121679 | 5/1988 |
| EP | 0 670 379 | 9/1995 |
| GB | 1 344 159 | 1/1974 |
| JP | 6-57453 | 3/1994 |
| JP | 6-192855 | 7/1994 |
| JP | 9-202980 | 8/1997 |
| JP | 2000-104183 | 4/2000 |
| JP | 2000282265 A | * 10/2000 |
| JP | 2000-309889 | 11/2000 |
| JP | 3387528 | 1/2003 |
| JP | 2003-105569 | 4/2003 |
| RU | 2 102 530 | 1/1998 |

OTHER PUBLICATIONS

Ono et al. Microetching Agent for Copper and Copper Alloy and Surface Treating Method Using the Same, Mar. 31, 1999, Machine translation of JP 2000282265 A into English, 10 pages.*

* cited by examiner

*Primary Examiner*—Nadine Norton
*Assistant Examiner*—Maki Angadi
(74) *Attorney, Agent, or Firm*—Hamre, Schumann, Mueller & Larson, P.C.

(57) ABSTRACT

An etchant for copper and copper alloys, includes an aqueous solution containing: 14 to 155 g/liter of cupric ion source in terms of a concentration of copper ions; 7 to 180 g/liter of hydrochloric acid; and 0.1 to 50 g/liter of azole, the azole including nitrogen atoms only as heteroatoms residing in a ring. A method for producing a wiring by etching of copper or copper alloys, includes the step of: etching a portion of a copper layer on an electrical insulative member that is not covered with an etching resist using the above-described etchant so as to form the wiring. Thereby, a fine and dense wiring pattern with reduced undercut can be formed.

10 Claims, 1 Drawing Sheet

ETCHANT, REPLENISHMENT SOLUTION AND METHOD FOR PRODUCING COPPER WIRING USING THE SAME

FIELD OF THE INVENTION

The present invention relates to an etchant and a replenishment solution for copper and copper alloys and a method for producing wirings using the same.

BACKGROUND OF THE INVENTION

When a copper wiring is formed by photoetching in course of the manufacturing of a printed wiring board, iron chloride based etchants, copper chloride based etchants, alkaline etchants and the like are used for the etchant. These etchants, however, have a problem called undercut in which copper beneath an etching resist is dissolved. Particularly, in the case of a finer wiring pattern, the undercut should be minimized.

Conventionally, an etchant for suppressing the undercut has been examined. For instance, JP 3387528 B proposes an aqueous solution containing: cupric chloride; hydrochloric acid; a 2-aminobenzothiazole based compound; polyethylene glycol and a polyamine compound.

However, such a conventional etchant is insufficient for suppressing undercut in some cases, and therefore an etchant with an increased effect for suppressing undercut is required.

SUMMARY OF THE INVENTION

Therefore, with the foregoing in mind, it is an object of the present invention to provide an etchant and a replenishment solution that can reduce undercut so as to form a fine and dense wiring pattern and a method for producing a copper wiring using the same.

An etchant of the present invention is an etchant for copper and copper alloys, and includes an aqueous solution containing: 14 to 155 g/liter of cupric ion source in terms of a concentration of copper ions; 7 to 180 g/liter of hydrochloric acid; and 0.1 to 50 g/liter of azole. The azole includes nitrogen atoms only as heteroatoms residing in a ring.

A replenishment solution of the present invention is added to the etchant of the present invention when the etchant is used repeatedly. The replenishment solution includes an aqueous solution containing: 7 to 360 g/liter of hydrochloric acid; and 0.1 to 50 g/liter of azole, the azole including nitrogen atoms only as heteroatoms residing in a ring.

A method for producing a wiring of the present invention is for etching of copper or copper alloys. The method includes the step of etching a portion of a copper layer on an electrical insulative member that is not covered with an etching resist using the etchant of the present invention so as to form the wiring.

DETAILED DESCRIPTION OF THE INVENTION

Figure 1A:
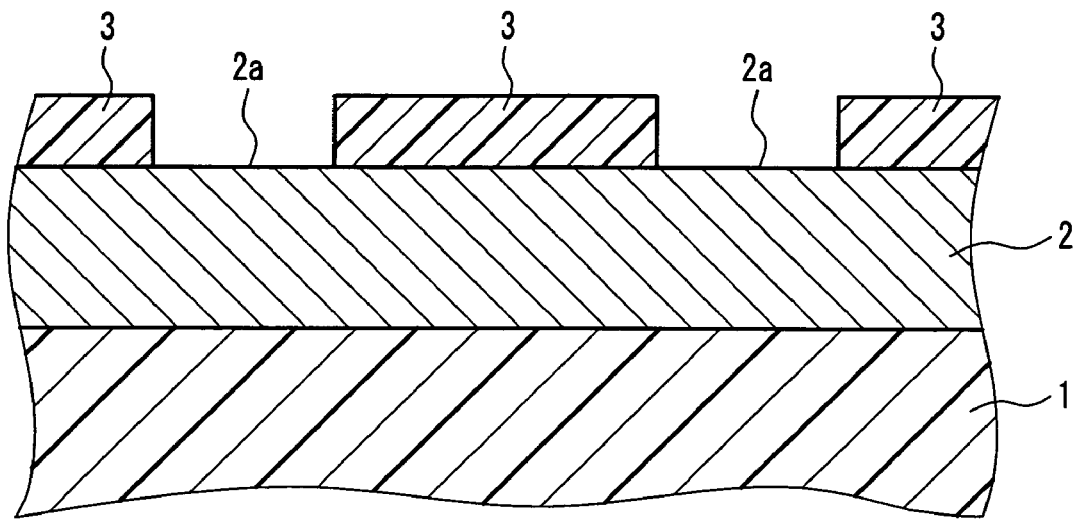
FIG. 1A and FIG. 1B are cross-sectional views showing a method for producing a wiring of a printed wiring board according to one embodiment of the present invention.

An etchant of the present invention is an acidic type etchant that contains a cupric ion source and hydrochloric acid as main components.

As the cupric ion source, copper chloride, copper hydroxide, copper sulfate, copper bromide, organic acid cuprate and the like are available. Among others, the use of copper chloride (cupric chloride) is preferable because it can increase the stability of an etching rate.

A concentration of the cupric ion source is 14 to 155 g/liter in terms of the concentration of copper ions, preferably 33 to 122 g/liter. In the case of the concentration becoming too low, an etching rate deteriorates. On the other hand, a too-high concentration reduces the tendency to dissolve, which makes an etching rate unstable. In the case of cupric chloride being used as the cupric ion source, a concentration of the cupric chloride is 30 to 330 g/liter, preferably 70 to 260 g/liter.

The etchant of the present invention contains hydrochloric acid. A concentration of the hydrochloric acid is 7 to 180 g/liter, preferably 18 to 110 g/liter. A too-low concentration of hydrochloric acid results in a failure to obtain a stable etching rate, and a too-high concentration degrades the dissolving stability of copper and might cause the generation of reoxidation on a surface of the copper.

In the etchant of the present invention, in order to suppress undercut, azole containing nitrogen atoms only as heteroatoms residing in a ring is added. The azole may be a monocyclic compound or a compound with condensed rings. Among others, an imidazole based compound, a triazole based compound or a tetrazole based compound is preferable, and two or more of these azoles may be combined for the use.

Available imidazole based compounds include: an alkyl imidazole group such as imidazole, 2-methylimidazole, 2-undecyl-4-methylimidazole and 2-phenylimidazole; and a benzimidazole group such as benzimidazole, 2-methylbenzimidazole, 2-undecyl benzimidazole, 2-phenyl benzimidazole and 2-mercaptobenzimidazole, for example. Among them, benzimidazole is preferable.

Available triazole based compounds include: 1,2,3-triazole, 1,2,4-triazole, 5-phenyl-1,2,4-triazole, 5-amino 1,2,4-triazole, benzotriazole, 1-methyl-benzotriazole and tolyltriazole, for example. Among them, benzotriazole is preferable.

Available tetrazole based compounds include: 1H-tetrazole, 5-amino-1H-tetrazole, 5-methyl-1H-tetrazole, 5-phenyl-1H-tetrazole, 5-mercapto-1H-tetrazole, 1-phenyl-5-mercapto-1H-tetrazole, 1-cyclohexyl-5-mercapto-1H-tetrazole and 5,5'-bis-1H-tetrazole, for example. Among them, 5-methyl-1H-tetrazole, 5-phenyl-1H-tetrazole and 5-amino-1H-tetrazole are preferable. Particularly, 5-phenyl-1H-tetrazole and 5-amino-1H-tetrazole are preferable.

A concentration of the azole is 0.1 to 50 g/liter, preferably 0.1 to 15 g/liter, and more preferably 0.2 to 10 g/liter. A too-low concentration makes the suppression of undercut insufficient and a too-high concentration degrades an etching rate.

The etchant of the present invention may contain at least one selected from the group consisting of a cationic surface active agent, glycol and glycol ether in order to enhance the stability of the solution and to conduct etching uniformly so that the surface configuration after the etching is uniform. As the cationic surface active agent, alkyl-type quaternary ammonium salts such as benzalkonium chloride and alkyltrimethylammonium chloride, for example, are available. As the glycol, ethylene glycol, diethylene glycol, propylene glycol, polyalkylene glycol and the like are available, for example. As the glycol ether, propylene glycol monomethyl ether, ethylene glycol monobutyl ether, 3-methyl-3-methoxybutanol, dipropylene glycol methyl ether, diethylene glycol butyl ether and the like are available, for example.

The etchant of the present invention may contain a solvent other than the above-stated glycol and glycol ether, a surface active agent other than the above-stated cationic surface active agent and various additives as needed.

In order to enhance the stability of the solution and to conduct etching uniformly so that the surface configuration after the etching is uniform, the etchant of the present invention further may include various additives as needed. The additives include: a solvent including alcohols such as methanol, ethanol, 1-propanol, 2-propanol, butanol and benzyl alcohol, amides such as N,N-dimethylformamide, dimethyl imidazolidinon and N-methyl pyrrolidone and sulfoxides such as dimethyl sulfoxide; anion surface active agents such as fatty acid salt, alkyl sulfate ester salt and alkylphosphate; nonionic surface active agents such as polyoxyethylene alkyl ether, polyoxypropylene alkyl ether and a block polymer of polyoxyethylene and polyoxypropylene; and ampholytic surface active agents including betains such as lauryl dimethyl aminoacetic acid betain, stearyl dimethyl aminoacetic acid betain, lauryl dimethylamine oxide and lauryl hydroxysulfobetain and aminocarboxylic acid.

The etchant of the present invention can be prepared easily by dissolving the above-stated respective components in water. As the water, ion-exchanged water, pure water, ultra-pure water and the like whose ionic substances and impurities have been removed are preferable.

A replenishment solution of the present invention is for adding to the etchant of the present invention when the etchant is used repeatedly. The replenishment solution contains 7 to 360 g/liter (preferably, 30 to 360 g/liter) of hydrochloric acid and 0.1 to 50 g/liter (preferably, 0.2 to 30 g/liter) of azole containing nitrogen atoms only as heteroatoms residing in a ring. The replenishment solution added allows the ratio of the respective components in the etchant to be maintained appropriately, whereby a wiring pattern with reduced undercut can be formed stably. The replenishment solution of the present invention further may contain a cupric ion source such as cupric chloride, in which the concentration of the cupric ion source does not exceed 14 g/liter in terms of the concentration of copper ions.

A method for using the etchant of the present invention is not limited especially, and available methods include a method of spraying it at a portion of a copper layer on an insulative material that is not covered with an etching resist, and a method of immersing an object to be processed in the etchant. Furthermore, in order to enhance the wettabiltiy of the etchant, prior to the processing with the etchant of the present invention, a surface of copper or copper alloys may be wetted in advance with water, hydrochloric acid with a low concentration or the above-stated replenishment solution. Furthermore, air may be blown utilizing bubbling or the like or an oxidant such as hydrogen peroxide may be added in order to restore the etching capability of the etchant by oxidizing cuprous ions, which are generated in the etchant as a result of the etching of copper, to cupric ions. A temperature of the etchant during the etching of copper preferably is 30 to 50° C.

When copper or copper alloys are etched by spraying the etchant of the present invention, preferably, a temperature of the etchant is kept at 30 to 50° C. and the spraying is carried out under a spraying pressure of 0.03 to 0.3 MPa. As a result, an etching rate obtained becomes 0.1 to 0.7 μm/s, which facilitates the suppression of undercut.

When the etchant of the present invention is used repeatedly, preferably, the etching of copper or copper alloys is carried out while the above-described replenishment solution is added to the etchant so that the concentration of copper ions in the etchant can be kept at 155 g/liter or lower, preferably, at 122 g/liter or lower. This can prevent the deposition of copper crystals. The concentration of copper ions preferably is measured by titration, a conductometric method and the like.

After the etching of copper or copper alloys using the etchant of the present invention, the etched portion preferably is washed with a cleaning fluid that is capable of dissolving the components of the etchant. Thereby, the components of the etchant that remain on a side face of the wirings, for example, can be removed, so that a short-circuit between the wirings, a failure in contact with a solder resist and the like, which result from the residual components, can be prevented. Herein, as the cleaning fluid, at least one solution selected from the group consisting of an acid solution, a solution containing a substance that is capable of forming a complex compound with copper ions and an organic solution is preferable. When the cleaning is carried out with an acid solution or a solution containing a substance that is capable of forming a complex compound with copper ions, the residual components including the cupric ion source (cupric chloride and the like) in the etchant and cuprous chloride and copper oxide generated by the reaction especially can be removed with efficiency. When the cleaning is carried out with an organic solution, the residual components of azole in the etchant especially can be removed with efficiency.

When the acid solution is used as the cleaning fluid, pH of the solution used preferably is adjusted to 4 or less by using hydrochloric acid, a mixed solution of hydrogen peroxide and sulfuric acid and the like. A preferable temperature of the cleaning fluid in that case is 15 to 50° C., and preferable cleaning methods include spray cleaning, ultrasonic cleaning, immersion cleaning and the like. When the solution containing a substance that is capable of forming a complex compound with copper ions is used as the cleaning fluid, an aqueous solution containing 20 to 200 g/liter of ammonia, monoethanolamine and the like preferably is used. A preferable temperature of the cleaning fluid in that case is 15 to 50° C., and preferable cleaning methods include spray cleaning, ultrasonic cleaning and the like. When the organic solution is used as the cleaning fluid, dipropylene glycol monomethylether and the like preferably are used, and a mixed solution of these organic solutions with water also is preferable. A preferable temperature of the cleaning fluid in that case is 15 to 50° C., and preferable cleaning methods include spray cleaning, ultrasonic cleaning and the like.

The etchant of the present invention is useful especially for producing a printed wiring board with a copper wiring pattern formed by etching. For instance, the etchant is useful when an etching resist is formed on a copper foil, an electroless copper plating film, an electrolytic copper plating film, a sputtered copper film or a multilayer film of them, which are formed on an insulative base material, and copper is etched at a portion that is not covered with the etching resist so as to form a wiring pattern. In this step, a thickness of the etching resist preferably is 40 μm or less. A too-large thickness degrades an etching rate. As the printed wiring board, a rigid board, a flexible board, a metal core board and a ceramic board are available, for example. As the etching resist, a resist including a so-called dry film and a liquid resist, made of resin, and a resist including a single layer of nickel or a plurality of metal layers, e.g., nickel/gold are available, for example.

Furthermore, the etchant of the present invention is useful especially for producing a copper wiring of a substrate on which semiconductor chips are mounted directly, such as a CSP substrate, a TAB substrate and a buildup substrate.

When the etchant of the present invention is used for the above-described wiring pattern producing methods, undercut can be reduced. Therefore, a printed wiring board having a fine and dense wiring pattern can be produced with an improved yield.

Figure 1B:
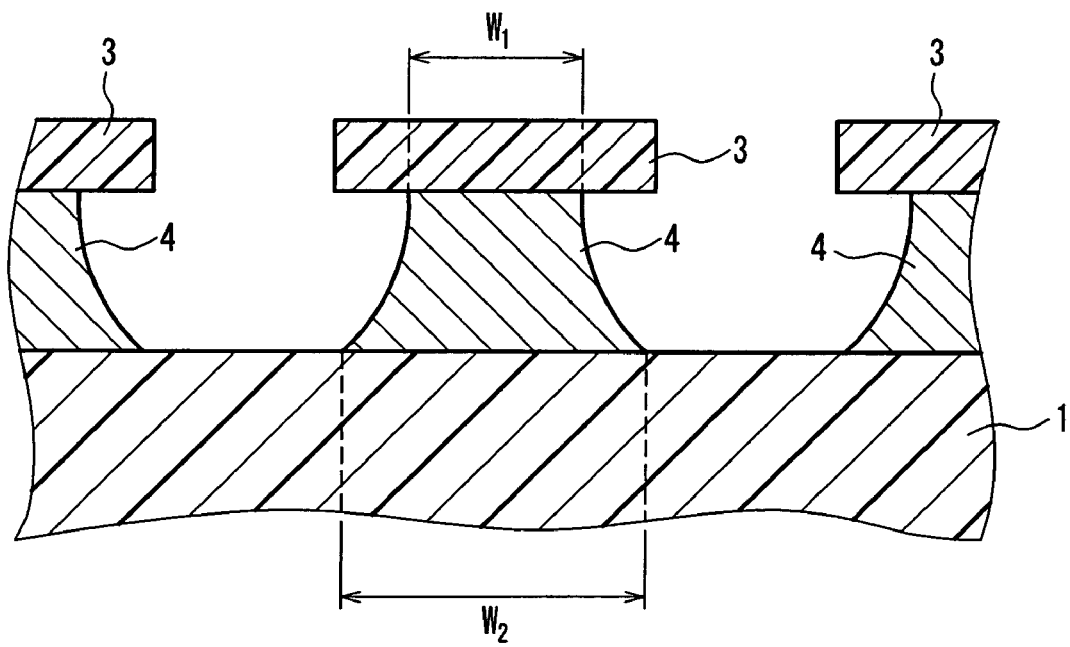

FIG. 1 shows cross-sectional views of a method for producing a wiring of a printed wiring board according to one embodiment of the present invention, where FIG. 1A shows a cross section of the printed wiring board prior to etching and FIG. 1B shows a cross section of the same subjected to the etching. In FIG. 1A, reference numeral 1 denotes an electrical insulative member such as a so-called glass epoxy base material in which glass fiber cloth is impregnated with epoxy resin, a so-called phenol paper base material in which paper is impregnated with phenol resin, a so-called aramid epoxy base material in which aramid fiber non-woven cloth is impregnated with epoxy resin, polyimide film and ceramic base material. Reference numeral 2 denotes a copper layer and 3 denotes an etching resist.

As shown in FIG. 1A and FIG. 1B, in the present invention, a portion 2a (See FIG. 1A) of the copper layer 2 on the electrical insulative member 1 that is not covered with the etching resist 3 is etched with the above-described etchant of the present invention so as to form a wiring 4 (See FIG. 1B). In this step, according to the present invention, a difference between a width $W_1$ of a top portion of the wiring 4 and a width $W_2$ of a base portion of the wiring 4 (i.e., ($W_2-W_1$)) can be reduced.

EXAMPLES

Hereinafter, the present invention will be described more specifically by way of examples. These examples are shown merely for illustrative purpose, and the present invention is not limited to these examples.

Examples 1 to 9 and Comparative Examples 1 to 3

Components indicated in Tables 1 and 2 were mixed so as to prepare etchants of Examples 1 to 9 and Comparative Examples 1 to 3. Herein, the etchant of Example 1 had a specific gravity of 1.13 (at 40° C.) and an oxidation-reduction potential of 550 mV. Meanwhile, copper foil of 12 μm in thickness was attached to a glass epoxy base material (GEA-67N produced by Hitachi Chemical Co., Ltd.) so as to prepare a copper-clad laminate (base material for printed wiring board) and a dry film resist of 15 μm in thickness (SUNFORT SPG-152 produced by Asahi Chemical Industry Co., Ltd.) was attached thereto, and a wiring pattern with a line and space=25 μm/25 μm (a width of a line was 25 μm and a space between lines was 25 μm) was formed. Subsequently, the etchants indicated in Tables 1 and 2 were sprayed under the conditions of 40° C. and a spraying pressure of 0.15 MPa so as to etch the copper foil, whereby copper wiring patterns were formed. Subsequently, 3 wt % of aqueous sodium hydroxide was sprayed thereto so as to peel off the dry film resist.

The thus obtained laminates each were cut and the cross-sectional shape of the formed wiring pattern as shown in FIG. 1 was observed to measure the difference ($W_2-W_1$) between the width ($W_2$) of the base portion of the wiring and the width ($W_1$) of the top portion. The results are shown in Tables 1 and 2.

TABLE 1

| Ex. No. | Composition | | $W_2 - W_1$ (μm) |
|---|---|---|---|
| 1 | cupric chloride | 130 g/liter | 4 |
|  | hydrochloric acid | 50 g/liter (as HCl) |  |
|  | benzimidazole | 8 g/liter |  |

TABLE 1-continued

| Ex. No. | Composition | | $W_2 - W_1$ (μm) |
|---|---|---|---|
|  | benzalkonium chloride | 0.05 g/liter |  |
|  | polyethylene glycol (average molecular weight 600) | 0.01 g/liter |  |
|  | ion-exchanged water | remainder |  |
| 2 | cupric chloride | 150 g/liter | 4 |
|  | hydrochloric acid | 50 g/liter (as HCl) |  |
|  | benzotriazole | 0.4 g/liter |  |
|  | ethylene glycol monobutyl ether | 5 g/liter |  |
|  | stearyltrimethyl ammonium chloride | 0.01 g/liter |  |
|  | ion-exchanged water | remainder |  |
| 3 | cupric chloride | 150 g/liter | 4.5 |
|  | hydrochloric acid | 50 g/liter (as HCl) |  |
|  | 5-methyl-1H-tetrazole | 0.8 g/liter |  |
|  | benzalkonium chloride | 0.002 g/liter |  |
|  | ion-exchanged water | remainder |  |
| 4 | cupric chloride | 300 g/liter | 3.5 |
|  | hydrochloric acid | 100 g/liter (as HCl) |  |
|  | 5-amino-1H-tetrazole | 8 g/liter |  |
|  | 3-methyl-3-methoxybutanol | 1 g/liter |  |
|  | ion-exchanged water | remainder |  |
| 5 | cupric chloride | 50 g/liter | 4 |
|  | hydrochloric acid | 20 g/liter (as HCl) |  |
|  | benzimidazole | 0.3 g/liter |  |
|  | diethylene glycol | 0.01 g/liter |  |
|  | ion-exchanged water | remainder |  |
| 6 | cupric chloride | 50 g/liter | 3 |
|  | hydrochloric acid | 150 g/liter (as HCl) |  |
|  | benzotriazole | 0.5 g/liter |  |
|  | ion-exchanged water | remainder |  |

TABLE 2

| Ex. No. | Composition | | $W_2 - W_1$ (μm) |
|---|---|---|---|
| 7 | cupric chloride | 300 g/liter | 3 |
|  | hydrochloric acid | 20 g/liter (as HCl) |  |
|  | 5-amino-1H-tetrazole | 1.5 g/liter |  |
|  | 2-phenoxyethanol | 1 g/liter |  |
|  | ion-exchanged water | remainder |  |
| 8 | cupric chloride | 150 g/liter | 3.5 |
|  | hydrochloric acid | 50 g/liter (as HCl) |  |
|  | 5-phenyl-1H-tetrazole | 0.3 g/liter |  |
|  | propylene glycol monomethyl ether | 15 g/liter |  |
|  | ion-exchanged water | remainder |  |
| 9 | cupric chloride | 100 g/liter | 4.5 |
|  | hydrochloric acid | 30 g/liter (as HCl) |  |
|  | 2-methylimidazole | 50 g/liter |  |
|  | diethylene glycol | 0.01 g/liter |  |
|  | ion-exchanged water | remainder |  |
| Comp. Ex. 1 | cupric chloride | 150 g/liter | 12 |
|  | hydrochloric acid | 50 g/liter (as HCl) |  |
|  | 2-aminobenzothiazole | 3 g/liter |  |
|  | ion-exchanged water | remainder |  |
| Comp. Ex. 2 | cupric chloride | 150 g/liter | 10 |
|  | hydrochloric acid | 50 g/liter (as HCl) |  |
|  | 2-aminobenzothiazole | 1 g/liter |  |
|  | polyethylene glycol (average molecular weight 4000) | 5 g/liter |  |
|  | ion-exchanged water | remainder |  |
| Comp. Ex. 3 | cupric chloride | 150 g/liter | 15 |
|  | hydrochloric acid | 50 g/liter (as HCl) |  |
|  | ion-exchanged water | remainder |  |

As is evident from Tables 1 and 2, the differences ($W_2-W_1$) between the width ($W_2$) of the base portion of the wiring and the width ($W_1$) of the top portion in Examples 1 to 9 were smaller than those in Comparative Examples 1 to 3, and it was confirmed that undercut could be reduced. Thereby, a printed wiring board with a fine and dense wiring pattern can be produced with a high yield.

Herein, in addition to the formation of a wiring on a printed wiring board, the present invention is applicable to various wirings as well, such as a wiring on a glass board, a wiring on a surface of a plastic board and a wiring on a surface of a semiconductor.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An etchant for copper and copper alloys, comprising an aqueous solution comprising:
   14 to 155 g/liter of cupric ion source in terms of a concentration of copper ions;
   7 to 180 g/liter of hydrochloric acid; and
   0.1 to 50 g/liter of a tetrazole based compound, the tetrazole based compound being at least one selected from the group consisting of 1H-tetrazole, 5-amino-1H-tetrazole, 5-methyl-1H-tetrazole, 5-phenyl-1H-1-tetrazole, and 5.5'-bis-1H-tetrazole.

2. The etchant according to claim 1, wherein 0.1 to 15 g/liter of the tetrazole based compound is present.

3. The etchant according to claim 1, further comprising at least one selected from the group consisting of a cationic surface active agent, glycol and glycol ether.

4. The etchant according to claim 1, wherein 30 to 330 g/liter of cupric chloride is present as the cupric ion source.

5. A replenishment solution that is added to the etchant according to claim 1 when the etchant is used repeatedly, the replenishment solution comprising an aqueous solution comprising:
   7 to 360 g/liter of hydrochloric acid; and
   0.1 to 50 g/liter of a tetrazole based compound, the tetrazole based compound being at least one selected from the group consisting of 1H-tetrazole, 5-amino-1H-tetrazole, 5-methyl-1H-tetrazole, 5-phenyl-1H-tetrazole, and 5.5'-bis-1H-tetrazole.

6. A method for producing a wiring by etching of copper or copper alloys, comprising the step of: etching a portion of a copper layer on an electrical insulative member that is not covered with an etching resist using the etchant according to claim 1 so as to form the wiring.

7. The method for producing a wiring according to claim 6, wherein the etchant is used repeatedly and a replenishment solution is added to the etchant so that a concentration of copper ions in the etchant can be kept at 155 g/liter or less, the replenishment solution comprising an aqueous solution comprising: 7 to 360 g/liter of hydrochloric acid; and 0.1 to 50 g/liter of azole, the azole comprising nitrogen atoms only as heteroatoms residing in a ring.

8. The method for producing a wiring according to claim 6, wherein after the etching of the copper or the copper alloys using the etchant, the etched portion is washed with a cleaning fluid that is capable of dissolving components of the etchant.

9. The method for producing a wiring according to claim 8, wherein the cleaning fluid is at least one solution selected from the group consisting of an acid solution, a solution containing a substance that is capable of forming a complex compound with copper ions and an organic solution.

10. The method for producing a wiring according to claim 6, wherein the etchant is used repeatedly and the copper or the copper alloys are etched while air is blown into the etchant.

* * * * *